US007226868B2

(12) United States Patent
Mosden et al.

(10) Patent No.: US 7,226,868 B2
(45) Date of Patent: Jun. 5, 2007

(54) METHOD OF ETCHING HIGH ASPECT RATIO FEATURES

(75) Inventors: Aelan Mosden, Poughkeepsie, NY (US); Sandra Hyland, Falls Church, VA (US); Minori Kajimoto, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/492,541

(22) PCT Filed: Oct. 31, 2002

(86) PCT No.: PCT/US03/31607

§ 371 (c)(1),
(2), (4) Date: Jun. 29, 2004

(87) PCT Pub. No.: WO03/037497

PCT Pub. Date: May 8, 2003

(65) Prior Publication Data

US 2004/0221797 A1   Nov. 11, 2004

Related U.S. Application Data

(60) Provisional application No. 60/330,788, filed on Oct. 31, 2001.

(51) Int. Cl.
*H01L 21/302* (2006.01)
(52) U.S. Cl. ............ 438/710; 438/706; 438/714; 216/67
(58) Field of Classification Search ........... 438/706, 438/710, 712, 714, 720; 216/58, 67
See application file for complete search history.

(56) References Cited

U.S. PATENT DOCUMENTS

| 5,421,891 | A |   | 6/1995 | Campbell et al. |
|-----------|---|---|--------|-----------------|
| 5,437,765 | A | * | 8/1995 | Loewenstein ................ 216/51 |
| 5,624,719 | A | * | 4/1997 | Tanabe et al. ............... 427/577 |
| 5,789,867 | A |   | 8/1998 | Westendorp et al. |
| 5,814,549 | A |   | 9/1998 | Wu |
| 5,900,163 | A |   | 5/1999 | Yi et al. |
| 5,911,887 | A |   | 6/1999 | Smith et al. |
| 5,926,094 | A | * | 7/1999 | Mamou .................... 340/572.3 |
| 6,071,597 | A | * | 6/2000 | Yang et al. ................. 428/209 |
| 6,155,200 | A |   | 12/2000 | Horiike et al. |
| 6,187,688 | B1 | * | 2/2001 | Ohkuni et al. ............. 438/725 |
| 6,395,586 | B1 | * | 5/2002 | Huang et al. ............... 438/149 |
| 6,635,185 | B2 | * | 10/2003 | Demmin et al. .............. 216/64 |
| 6,635,566 | B1 | * | 10/2003 | Blosse et al. ............... 438/638 |
| 6,679,981 | B1 | * | 1/2004 | Pan et al. ............. 204/298.06 |
| 6,802,933 | B2 | * | 10/2004 | Khan et al. ............ 156/345.26 |
| 6,809,012 | B2 | * | 10/2004 | Yamazaki et al. .......... 438/473 |
| 6,890,859 | B1 | * | 5/2005 | Bamnolker et al. ......... 438/700 |
| 2002/0098627 | A1 | * | 7/2002 | Pomarede et al. .......... 438/149 |

FOREIGN PATENT DOCUMENTS

| TW | 392245 | 7/1987 |
|----|--------|--------|
| TW | 306026 | 5/1997 |

* cited by examiner

*Primary Examiner*—Lan Vinh
(74) *Attorney, Agent, or Firm*—Oblon, Spivak, McClelland, Maier & Neustadt, P.C.

(57) ABSTRACT

A plasma processing system for and method of utilizing an improved etch chemistry for effectively etching high aspect ratio silicon features. The process chemistry employs precursor gases suitable for producing a fluorine/chlorine etch chemistry as well as precursor gases suitable for forming chemical bonds of sufficient strength to create stable feature side-walls. The improved process chemistries include $SO_2/SF_4/SiCl_4$, $SO_2/SF_4/Cl_2$, $SO_2/SiF_4/SiCl_4$, $SO_2SIF_4/Cl_2$, $O_2/F_2/Cl_2$, $N_{2\ O/F}2/Cl_2$, and $NO_2/F_2/Cl_2$-based chemistries.

43 Claims, 6 Drawing Sheets

| Bond | Bond strength | Plus/minus | Presumed state |
|---|---|---|---|
| Br--Cl | 52.3 | | Gas |
| F--O | 53 | 4 | Gas |
| Br--F | 55.89 | 0.05 | Gas |
| Br--O | 56.2 | 0.1 | Gas |
| F--Cl | 59.88 | 0.02 | Gas |
| Cl--O | 65 | 1 | Gas |
| N--Br | 66 | 5 | Gas |
| Si--H | 71.34 | 0.11 | Gas |
| Si--Si | 78.1 | 2.4 | Solid |
| S--F | 81.9 | 1.2 | Gas |
| Si--Br | 82 | 12 | Solid |
| Cl--N | 93 | 12 | Gas |
| H--O | 102 | | Gas |
| Si--N | 105 | 9 | Solid |
| F--P | 105 | 23 | Gas |
| Si--Cl | 109 | 10 | Gas |
| Si--Se | 127 | 6 | Solid |
| Si--F | 129 | 3 | Gas |
| H--F | 135.9 | | Gas |
| Si--S | 148 | 3 | Solid |
| Si--O | 190.9 | 2 | Solid |

FIG. 6.

METHOD OF ETCHING HIGH ASPECT RATIO FEATURES

CROSS-REFERENCE TO RELATED APPLICATIONS

The present application claims priority to U.S. provisional Ser. No. 60/330,788, filed on Oct. 31, 2001, the entire contents of which are herein incorporated by reference.

BACKGROUND OF THE INVENTION

1. Field of Invention

The present invention relates to etch chemistries and more particularly to a method for utilizing improved etch chemistries to etch high aspect ratio features.

2. Discussion of the Background

In the semiconductor industry there is a demand for increasing the speed of integrated circuits in general, and memory devices in particular. These demands force semiconductor manufacturers to make devices smaller and smaller on a surface of a semiconductor wafer. Accordingly, the increasingly small top critical dimensions (CDs) used to manufacture semiconductor chips require deep trench capacitors, which are used to store charge for memory, that must go deeper into the silicon to retain the same internal surface area, and, hence, the same capacitance. These smaller top CDs make it more difficult for etchant species to enter such deeply etched holes during etching and for effluent species to be exhausted from the feature as it etches deeper into the silicon wafer. This interaction results in much slower etching and therefore longer etch times, which in turn results in problems providing a mask that will survive the increasingly long etch times. Current technology is approaching a limit of the current masks to be effective with the current chemistry for deep trench etching.

Current deep trench etch chemistries rely on the dissociation of HBr with fluorine-containing gases and $O_2$. By-products of these reactions include $SiO_2$, HF, and other Si—F—Br species. Bromine etches silicon surfaces in a reaction that has a strong physical component in addition to a chemical component. This physical component implies silicon is etched more readily where there exists a direct line-of-sight between the silicon etching surface and the plasma. Silicon dioxide ($SiO_2$), produced by the chemical interaction of silicon from the etched surface and oxygen ($O_2$) from the plasma, forms on the vertical surfaces of the aforementioned trenches where there exists a lesser physical component for etching. In general, process manipulation of $SiO_2$ formation is utilized to control the profile and width of the final trenches.

However, several limitations have been cited for deep trench etch pertaining to the current etch chemistry. For example, mask erosion, particularly near the feature entrance, has posed a formidable issue with current processes. At present, the mask erosion is attributed to chemical attack by HF that is formed by interactions between HBr and $NF_3$. Additionally, mask erosion is attributed to physical sputtering by high energy ions, and decreasing $SiO_2$ surface protection resulting from low silicon availability from smaller (high aspect ratio) features.

Figure 1:
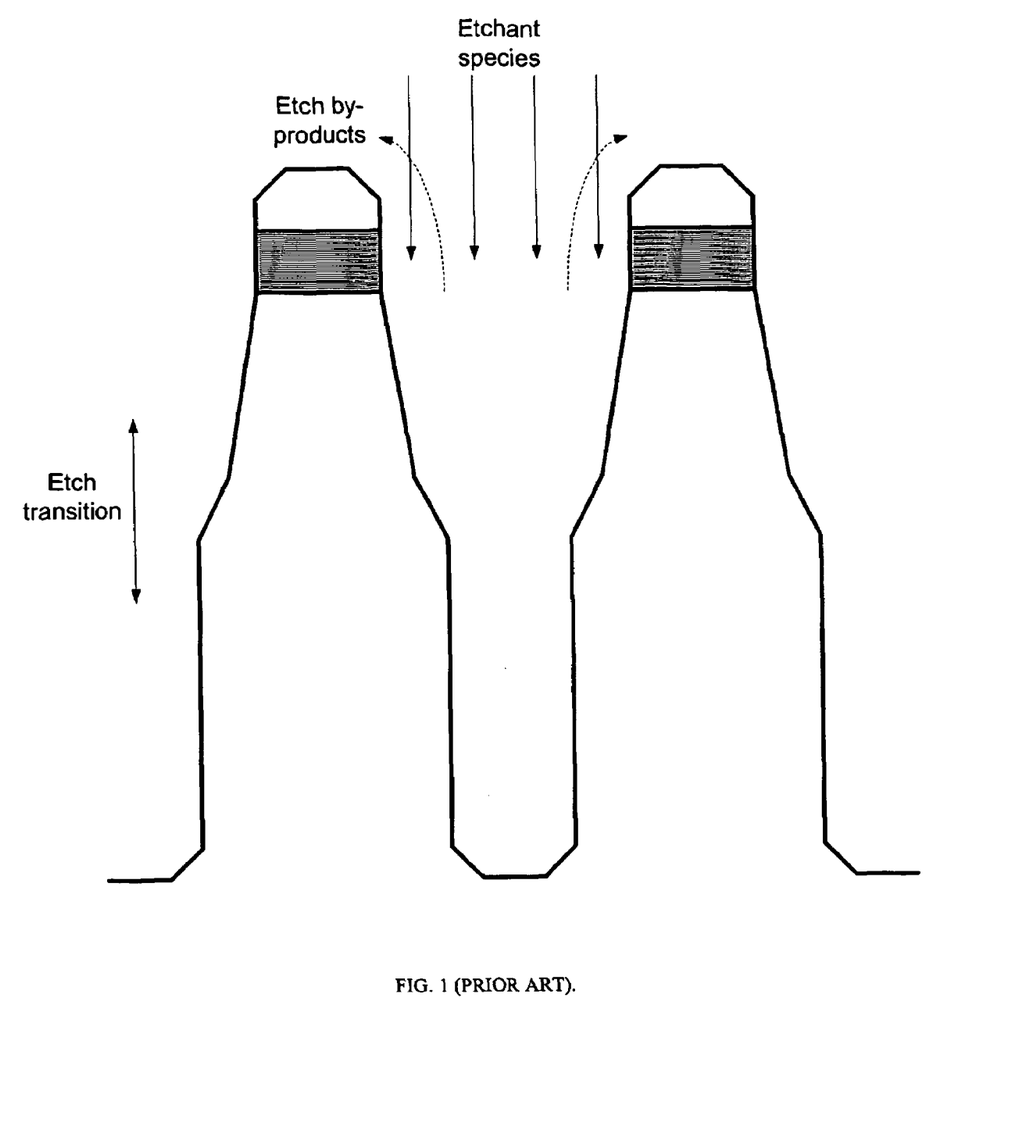
FIG. 1 shows a schematic cross-sectional view of a substrate feature.

In addition to mask erosion, current process chemistries suffer from low etch rates at depths greater than 5 microns for 0.13 to 0.10 micron features or, more generally, once the feature aspect ratio L/d exceeds 50. Beyond this feature aspect ratio, the silicon etch depends primarily on chemical etch rather than physical etch (see FIG. 1).

And lastly, current process chemistries are unable to control the upper profile and maintain an anisotropic etch with parallel side-walls.

In summary, bromine chemistries, particularly those introduced to the plasma as HBr, create HF as a by-product when used in conjunction with fluorine chemistry. The presence of HF in the processing plasma leads to an aggressive attack of the oxide mask. Therefore, an improved chemistry eliminating hydrogen from the plasma is needed to alleviate the aforementioned shortcomings of current practice.

SUMMARY OF THE INVENTION

The present invention provides a plasma processing system for and method of utilizing an improved etch chemistry for effectively etching high aspect ratio silicon features. The process chemistry employs precursor gases suitable for producing a fluorine/chlorine etch chemistry as well as precursor gases suitable for forming chemical bonds of sufficient strength to create stable feature side-walls.

The present invention advantageously provides a method of processing a substrate including the steps of supplying a process gas having a first gas containing oxygen, a second gas containing fluorine, and a third gas containing chlorine, and creating a plasma from the process gas.

The present invention further advantageously provides a method of processing a substrate including the steps of supplying a process gas having at least one deposition gas and at least one etching gas, and creating a plasma from the process gas.

Additionally, the present invention advantageously provides a plasma processing system including a process chamber, a gas injection system configured to inject a process gas within the process chamber, and a plasma source configured to create a plasma from the process gas. The process gas advantageously includes a first gas containing oxygen, a second gas containing fluorine, and a third gas containing chlorine.

The present invention further advantageously provides a plasma processing system including a process chamber, a gas injection system configured to inject a process gas within the process chamber, and a plasma source configured to create a plasma from the process gas. The process gas advantageously includes a deposition gas and an etching gas.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF PREFERRED EMBODIMENTS

Figure 2:
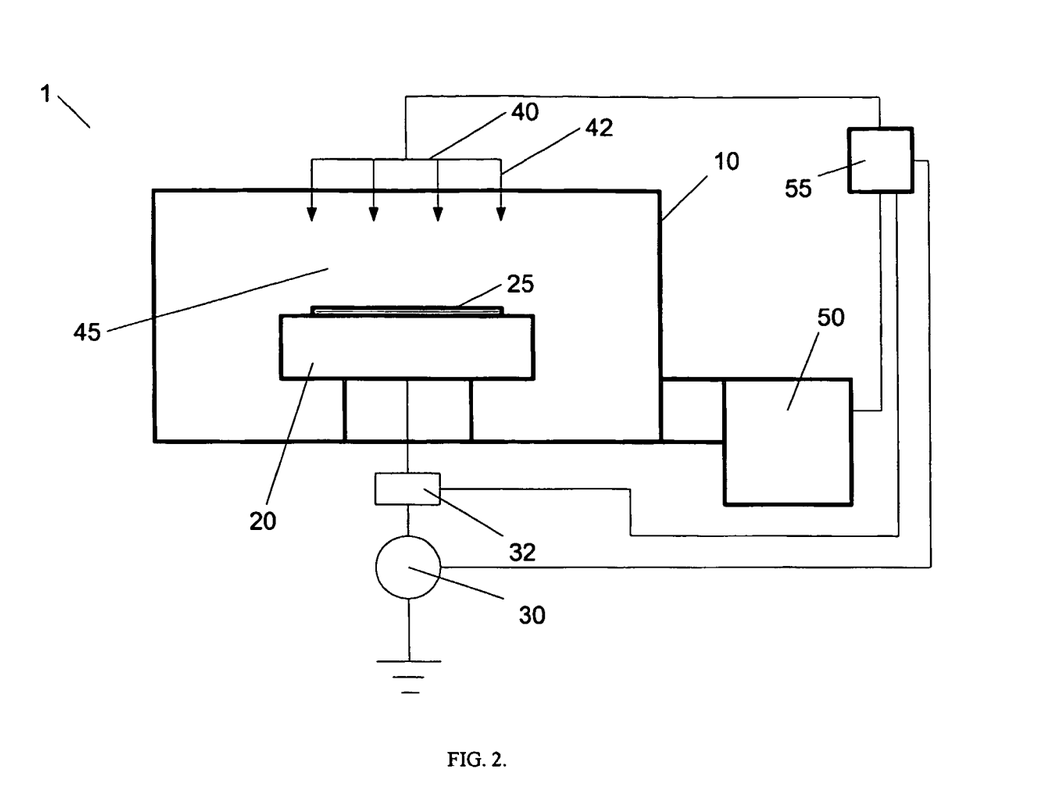
FIG. 2 shows a plasma processing system according to a first embodiment of the present invention.

A plasma processing device 1 is depicted in FIG. 2 including a chamber 10, a substrate holder 20, upon which a substrate 25 to be processed is affixed, a gas injection system 40, and a vacuum pumping system 50. Chamber 10 is configured to facilitate the generation of plasma in a processing region 45 adjacent a surface of substrate 25, wherein plasma is formed via collisions between heated electrons and an ionizable gas. An ionizable gas or mixture of gases is introduced via the gas injection system 40 and the process pressure is adjusted. For example, a gate valve (not shown) is used to throttle the vacuum pumping system 50. Desirably, plasma is utilized to create materials specific to a pre-determined materials process, and to aid either the deposition of material to a substrate 25 or the removal of material from the exposed surfaces of the substrate 25.

Substrate 25 is transferred into and out of chamber 10 through a slot valve (not shown) and chamber feed-through (not shown) via robotic substrate transfer system where it is received by substrate lift pins (not shown) housed within substrate holder 20 and mechanically translated by devices housed therein. Once the substrate 25 is received from the substrate transfer system, it is lowered to an upper surface of the substrate holder 20.

In an alternate embodiment, the substrate 25 is affixed to the substrate holder 20 via an electrostatic clamp (not shown). Furthermore, the substrate holder 20 further includes a cooling system including a re-circulating coolant flow that receives heat from the substrate holder 20 and transfers heat to a heat exchanger system (not shown), or when heating, transfers heat from the heat exchanger system. Moreover, gas may be delivered to the back-side of the substrate to improve the gas-gap thermal conductance between the substrate 25 and the substrate holder 20. Such a system is utilized when temperature control of the substrate is required at elevated or reduced temperatures. For example, temperature control of the substrate may be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermoelectric heaters/coolers are included.

In a first embodiment, shown in FIG. 2, the substrate holder 20 further serves as an electrode through which radio frequency (RF) power is coupled to plasma in the processing region 45. For example, the substrate holder 20 is electrically biased at a RF voltage via the transmission of RF power from an RF generator 30 through an impedance match network 32 to the substrate holder 20. The RF bias serves to heat electrons and, thereby, form and maintain plasma. In this configuration, the system operates as a reactive ion etch (RIE) reactor, wherein the chamber and upper gas injection electrode serve as ground surfaces. A typical frequency for the RF bias ranges from 1 MHz to 100 MHz and is preferably 13.56 MHz.

In an alternate embodiment, RF power is applied to the substrate holder electrode at multiple frequencies. Furthermore, the impedance match network 32 serves to maximize the transfer of RF power to plasma in processing chamber 10 by minimizing the reflected power. Match network topologies (e.g. L-type, π-type, T-type, etc.) and automatic control methods are known in the art.

With continuing reference to FIG. 2, a process gas 42 is introduced to the processing region 45 through the gas injection system 40. Gas injection system 40 can include a showerhead, wherein the process gas 42 is supplied from a gas delivery system (not shown) to the processing region 45 through a gas injection plenum (not shown), a series of baffle plates (not shown) and a multi-orifice showerhead gas injection plate (not shown).

Vacuum pump system 50 preferably includes a turbomolecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is employed. TMPs are useful for low pressure processing, typically less than 50 mTorr. At higher pressures, the TMP pumping speed falls off dramatically. For high pressure processing (i.e. greater than 100 mTorr), a mechanical booster pump and dry roughing pump are used.

A computer 55 includes a microprocessor, a memory, and a digital I/O port capable of generating control voltages sufficient to communicate and activate inputs to the plasma processing system 1 as well as monitor outputs from the plasma processing system 1. Moreover, the computer 55 is coupled to and exchanges information with the RF generator 30, the impedance match network 32, the gas injection system 40 and the vacuum pump system 50. A program stored in the memory is utilized to activate the inputs to the aforementioned components of a plasma processing system 1 according to a stored process recipe. One example of computer 55 is a DELL PRECISION WORKSTATION 610™, available from Dell Corporation, Dallas, Tex.

Figure 3:
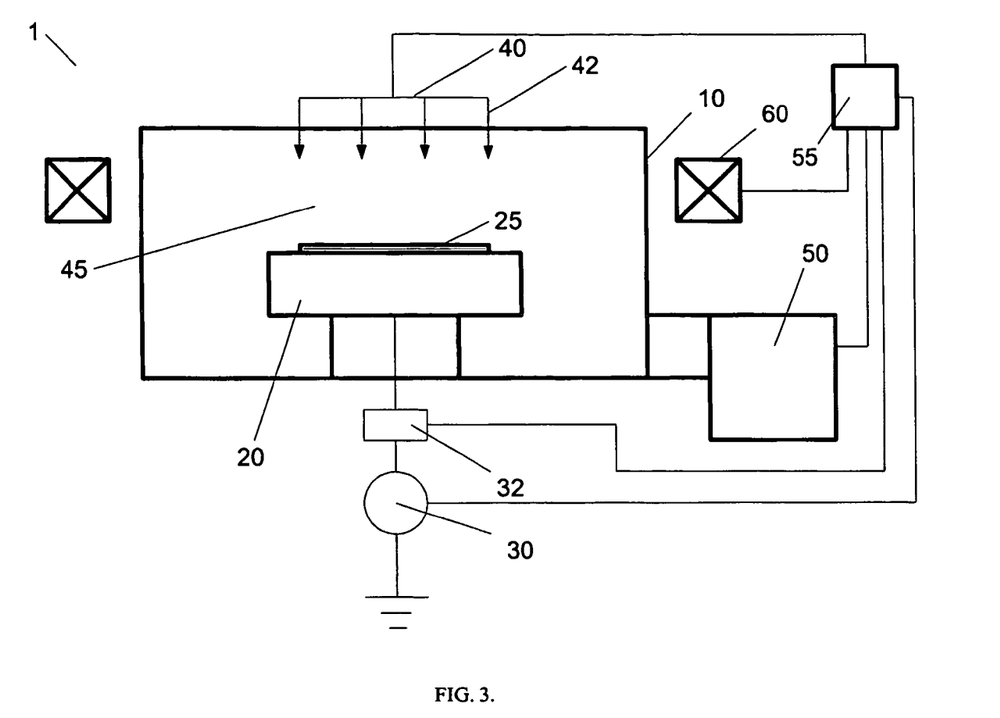
FIG. 3 shows a plasma processing system according to a second embodiment of the present invention.

In a second embodiment, shown in FIG. 3, the plasma processing system 1 further includes either a mechanically or electrically rotating dc magnetic field system 60, in order to potentially increase plasma density and/or improve plasma processing uniformity, in addition to those components described with reference to FIG. 2. Moreover, the computer 55 is coupled to the rotating magnetic field system 60 in order to regulate the speed of rotation and field strength.

Figure 4:
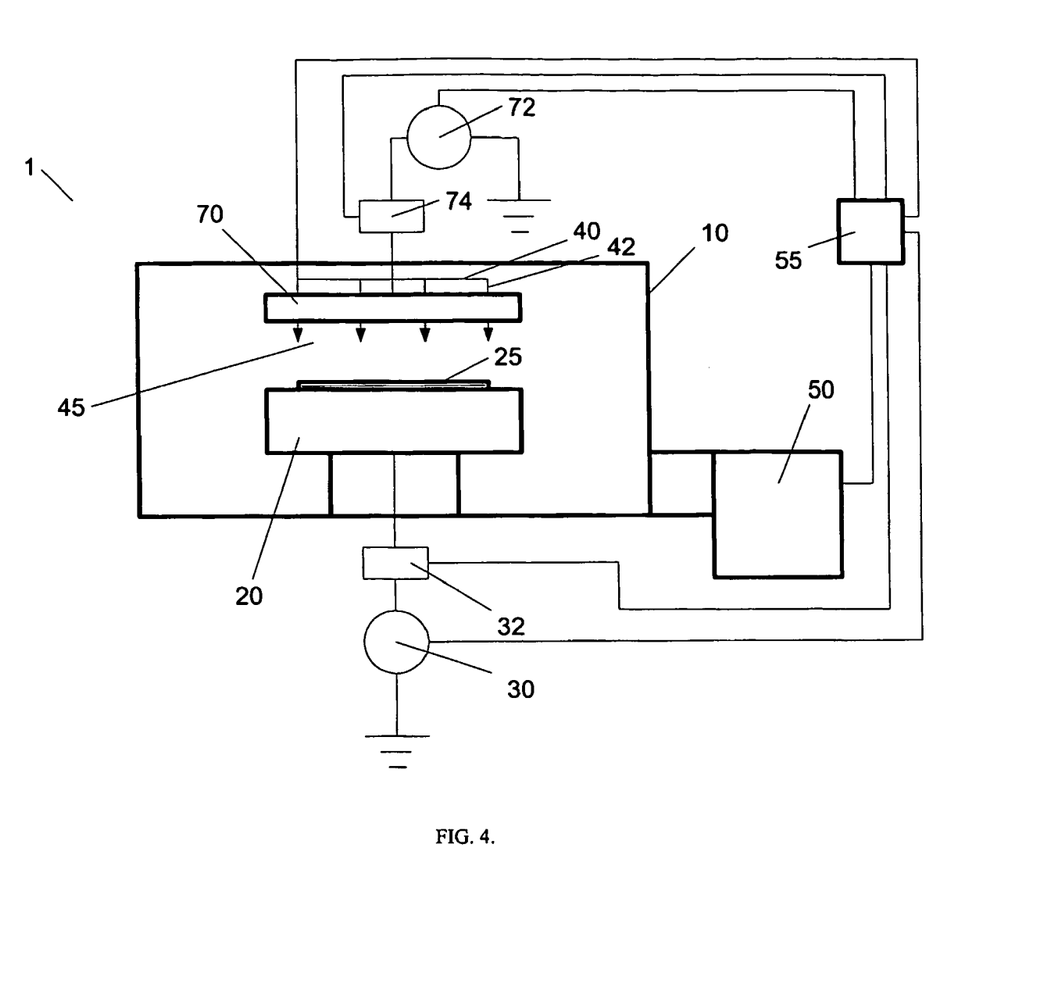
FIG. 4 shows a plasma processing system according to a third embodiment of the present invention.

In a third embodiment, shown in FIG. 4, the plasma processing system 1 of FIG. 2 further includes an upper plate electrode 70 to which RF power is coupled from an RF generator 72 through an impedance match network 74. A typical frequency for the application of RF power to the upper electrode ranges from 10 MHz to 200 MHz and is preferably 60 MHz. Additionally, a typical frequency for the application of power to the lower electrode ranges from 0.1 MHz to 30 MHz and is preferably 2 MHz. Moreover, the computer 55 is coupled to the RF generator 72 and the impedance match network 74 in order to control the application of RF power to the upper electrode 70.

Figure 5:
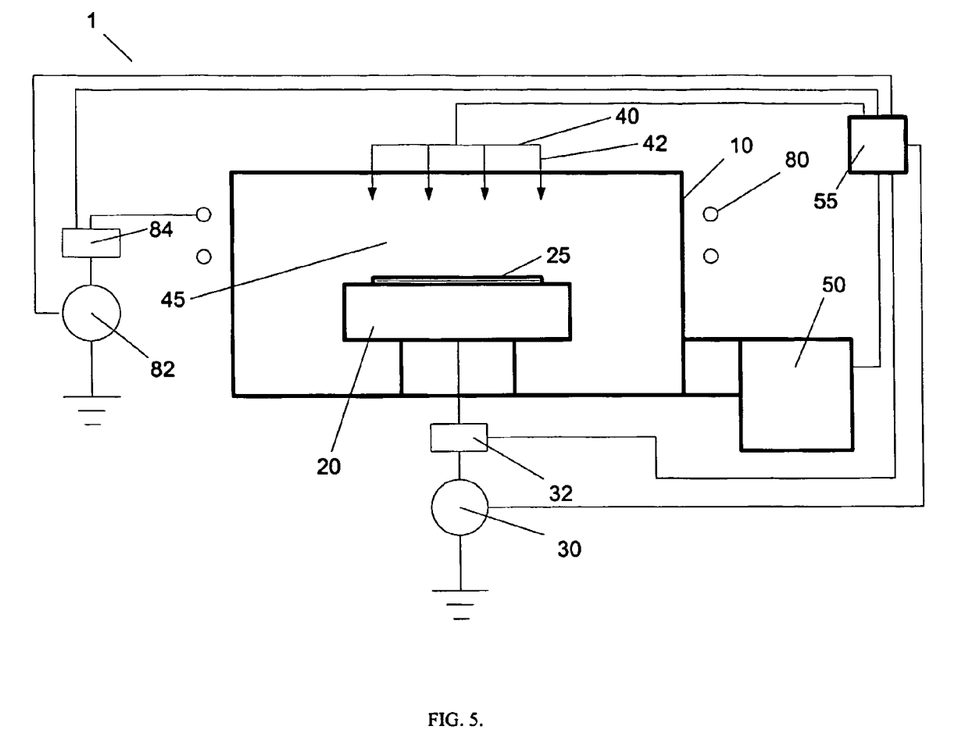
FIG. 5 shows a plasma processing system according to a fourth embodiment of the present invention.

In a fourth embodiment, shown in FIG. 5, the plasma processing system of FIG. 2 further includes an inductive coil 80 to which RF power is coupled via an RF generator 82 through an impedance match network 84. RF power is inductively coupled from the inductive coil 80 through a dielectric window (not shown) to the plasma processing region 45. A typical frequency for the application of RF power to the inductive coil 80 ranges from 10 MHz to 100 MHz and is preferably 13.56 MHz. Similarly, a typical frequency for the application of power to the chuck electrode ranges from 0.1 MHz to 30 MHz and is preferably 13.56 MHz. In addition, a slotted Faraday shield (not shown) is employed to reduce capacitive coupling between the inductive coil 80 and plasma. Moreover, the computer 55 is coupled to the RF generator 82 and the impedance match network 84 in order to control the application of power to the inductive coil 80.

In an alternate embodiment, the plasma is formed using electron cyclotron resonance (ECR). In yet another embodiment, the plasma is formed from the launching of a Helicon wave. In yet another embodiment, the plasma is formed from a propagating surface wave.

Referring now to FIGS. 2 through 5, the process gas 42 is introduced to the processing region 45 through the gas injection system 40. The process gas 42 includes one or more gas species specifically chosen to, in the presence of heated electrons, produce a process chemistry having chemical reactants suitable for etching silicon as well as forming chemical constituents suitable for forming stable films on feature side-walls. The process chemistry, to be described below, is utilized to effectively etch silicon while maintaining stable feature side-walls and preventing the excessive erosion of the photoresist mask by unwanted HF by-products.

Figure 6:
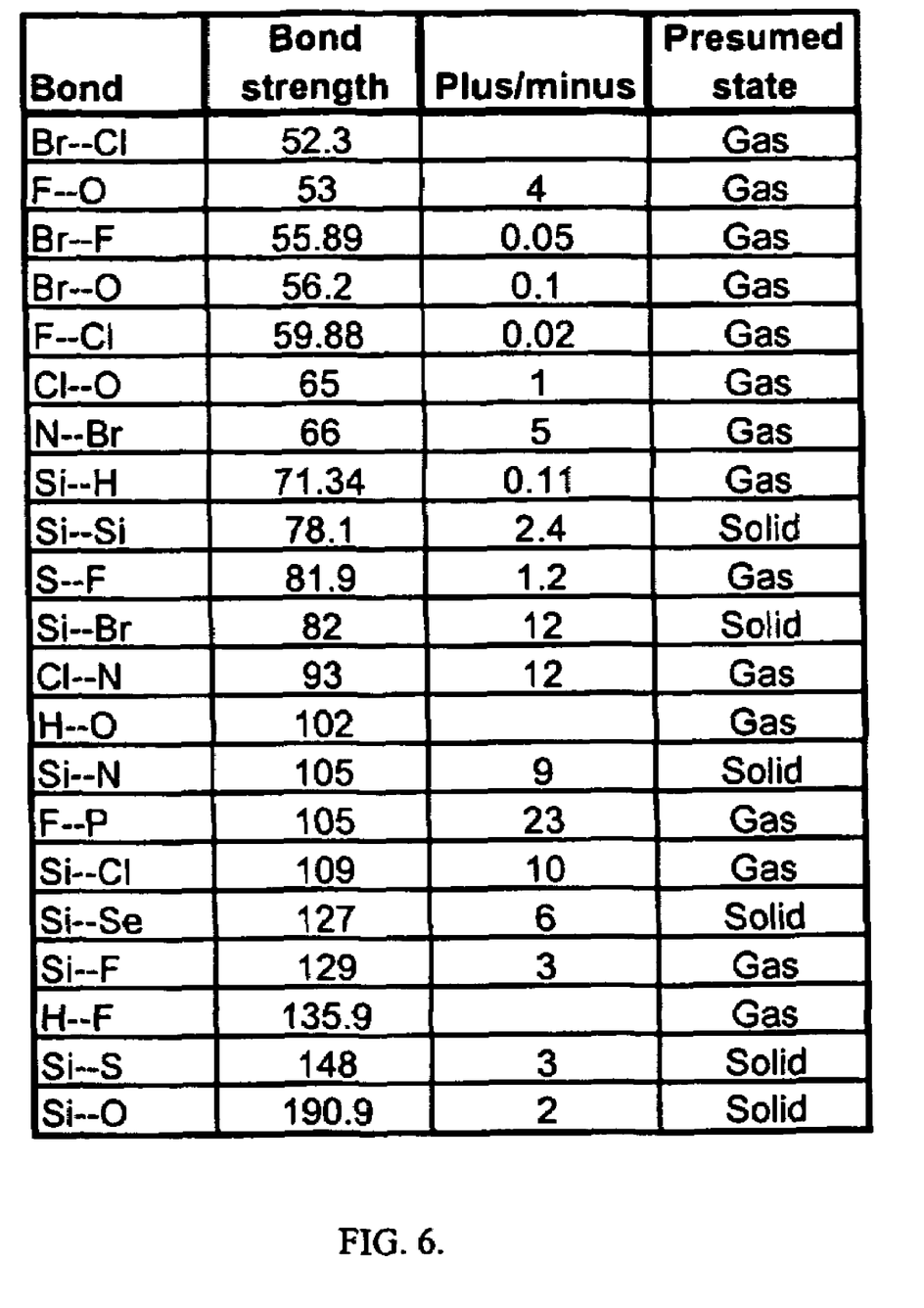
FIG. 6 shows a table of bond strengths for several chemical bonds.

Feature side-wall stability is achieved by choosing the process chemistry to include species which forms chemical bonds of high bond strength. Utilizing the table shown in FIG. 6, the use of sulfur and/or oxygen containing gases with a fluorine/chlorine etch chemistry produces feature side-wall films including Si—S and/or Si—O bonds which are excellent candidates for side-wall stability. Therefore, the process gas 42 is selected from a set of deposition (i.e. film forming) gases such as $SO_2$, $O_2$, $N_2O$, and $NO_2$, and a set of etch gases such as $SF_6$, $SF_4$, $F_2$, $SiF_4$, $SiCl_4$, and $Cl_2$.

In a preferred embodiment, the process gas 42 includes a first gas containing oxygen, a second gas containing fluorine and a third gas containing chlorine. For example, the first gas includes $SO_2$, the second gas includes $SF_4$, and the third gas includes $SiCl_4$. The gas injection system 40 is controlled via a stored process recipe on the computer 55 to regulate a flow rate of the first gas containing oxygen, a flow rate of the second gas containing fluorine, and a flow rate of the third gas containing chlorine. For example, the first flow rate of the first gas containing oxygen range from 1 to 200 sccm, and it preferably ranges from 1 to 100 sccm; the second flow rate of the second gas containing fluorine ranges from 1 to 750 sccm, and it preferably ranges from 1 to 300 sccm; and the third flow rate of the third gas containing chlorine ranges from 5 to 400 sccm, and it preferably ranges from 10 to 150 sccm.

In an alternate embodiment, if a sufficient amount of Si is available (for example, from the surface of substrate 25), then the process chemistry includes $SO_2$ is the first gas containing oxygen, $SF_4$ as the second gas containing fluorine, and $Cl_2$ as the third gas containing chlorine. Similarly, the gas injection system 40 is controlled via a stored process recipe on the computer 55 to regulate the flow rate of the first gas containing oxygen, the flow rate of the second gas containing fluorine, and the flow rate of the third gas containing chlorine. For example, the flow rate of the first gas containing oxygen ranges from 1 to 200 sccm, and it preferably ranges from 1 to 100 sccm; the second flow rate of the second gas containing fluorine ranges from 1 to 750 sccm, and it preferably ranges from 1 to 300 sccm; and the third flow rate of the third gas containing chlorine ranges from 10 to 750 sccm, and it preferably ranges from 25 to 300 sccm.

In an alternate embodiment, if an insufficient amount of Si is available (for example, from the surface of substrate 25), then the process chemistry includes $SO_2$ as the first gas containing oxygen, $SiF_4$ as the second gas containing fluorine, and $SiCl_4$ as the third gas containing chlorine. Similarly, the gas injection system 40 is controlled via a stored process recipe on the computer 55 to regulate the flow rate of the first gas containing oxygen, the flow rate of the second gas containing fluorine and the flow rate of the third gas containing chlorine. For example, the flow rate of the first gas containing oxygen ranges from 1 to 200 sccm, and it preferably ranges from 1 to 100 sccm; the second flow rate of the second gas containing fluorine ranges from 1 to 750 sccm, and it preferably ranges from 1 to 300 sccm; and the third flow rate of the third gas containing chlorine ranges from 5 to 400 sccm, and it preferably ranges from 10 to 150 sccm.

In an alternate embodiment, if an insufficient amount of Si is available (for example, from the surface of substrate 25), then the process chemistry includes $SO_2$ as the first gas containing oxygen, $SiF_4$ as the second gas containing fluorine, and $Cl_2$ as the third gas containing chlorine. Similarly, the gas injection system 40 is controlled via a stored process recipe on the computer 55 to regulate the flow rate of the first gas containing oxygen, the flow rate of the second gas containing fluorine, and the flow rate of the third gas containing chlorine. For example, the flow rate of the first gas containing oxygen ranges from 1 to 200 sccm, and it preferably ranges from 1 to 100 sccm; the second flow rate of the second gas containing fluorine ranges from 1 to 750 sccm, and it preferably ranges from 1 to 300 sccm; and the third flow rate of the third gas containing chlorine ranges from 10 to 750 sccm, and it preferably ranges from 25 to 300 sccm.

In an alternate embodiment, if it is desired to remove sulfur (S) from the process chemistry, then the process chemistry includes $O_2$ as the first gas containing oxygen, $F_2$ as the second gas containing fluorine, and $Cl_2$ as the third gas containing chlorine. The use of sulfur in the process chemistry advantageously provides for the potential of forming Si—S bonds and, therefore, very stable films for feature side-wall protection. However, it is possible that the presence of sulfur leads to: (1) the difficult removal from (or cleaning of) silicon surfaces during post-etch treatment, (2) the formation of sulfur/moisture chemistry which can damage the substrate during post-etch processing without a sulfur removal (i.e. cleaning) step, and (3) the formation of sulfur/moisture chemistry on chamber components which can damage critical chamber surfaces over time. Similarly, the gas injection system 40 is controlled via a stored process recipe on the computer 55 to regulate the flow rate of the first gas containing oxygen, the flow rate of the second gas containing fluorine, and the flow rate of the third gas containing chlorine. For example, the flow rate of the first gas containing oxygen ranges from 1 to 200 sccm, and it preferably ranges from 1 to 100 sccm; the second flow rate of the second gas containing fluorine ranges from 1 to 1500 sccm, and it preferably ranges from 1 to 600 sccm; and the third flow rate of the third gas containing chlorine ranges from 10 to 750 sccm, and it preferably ranges from 25 to 300 sccm.

In an alternate embodiment, the process chemistry includes $NO_2$ as the first gas containing oxygen, $F_2$ as the second gas containing fluorine, and $Cl_2$ as the third gas containing chlorine. Similarly, the gas injection system 40 is controlled via a stored process recipe on the computer 55 to regulate the flow rate of the first gas containing oxygen, the flow rate of the second gas containing fluorine, and the flow rate of the third gas containing chlorine. For example, the flow rate of the first gas containing oxygen ranges from 1 to 200 sccm, and it preferably ranges from 1 to 100 sccm; the second flow rate of the second gas containing fluorine ranges from 1 to 1500 sccm, and it preferably ranges from 1 to 600 sccm; and the third flow rate of the third gas containing chlorine ranges from 10 to 750 sccm, and it preferably ranges from 25 to 300 sccm.

In an alternate embodiment, the process chemistry includes $N_2O$ as the first gas containing oxygen, $F_2$ as the second gas containing fluorine, and $Cl_2$ as the third gas containing chlorine. Similarly, the gas injection system 40 is controlled via a stored process recipe on the computer 55 to regulate the flow rate of the first gas containing oxygen, the flow rate of the second gas containing fluorine, and the flow rate of the third gas containing chlorine. For example, the flow rate of the first gas containing oxygen ranges from 1 to 400 sccm, and it preferably ranges from 1 to 200 sccm; the second flow rate of the second gas containing fluorine ranges from 1 to 1500 sccm, and it preferably ranges from 1 to 600 sccm; and the third flow rate of the third gas containing chlorine ranges from 10 to 750 sccm, and it preferably ranges from 25 to 300 sccm.

In an alternate embodiment, the process chemistry includes a first gas $O_2$ as a deposition gas and a second gas $F_2$ as an etching gas. Similarly, the gas injection system 40 is controlled via a stored process recipe on the computer 55 to regulate the flow rate of the first gas containing oxygen and the flow rate of the second gas containing fluorine. For example, the flow rate of the first gas containing oxygen ranges from 1 to 200 sccm, and it preferably ranges from 1 to 100 sccm; and the second flow rate of the second gas containing fluorine ranges from 1 to 1500 sccm, and it preferably ranges from 1 to 600 sccm.

Lastly, in an alternate embodiment, an inert gas is added to any one of the aforementioned process gas chemistries. The inert gas is at least one of argon, helium, xenon, krypton, and nitrogen. For example, the addition of inert gas to the process chemistry is used to dilute the process gas or adjust the process gas partial pressure(s). Furthermore, for example, the addition of inert gas can aid the physical component of the feature etch.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A method of processing a substrate, the method comprising the steps of:
supplying a process gas including a first gas containing $SO_2$, a second gas containing either $SiF_4$ or $SF_4$ and a third gas containing chlorine; and
creating a plasma from the process gas.

2. The method according to claim 1, further comprising performing an etching process using said process gas.

3. The method according to claim 1, wherein the third gas containing chlorine comprises at least one of $SiCl_4$ and $Cl_2$.

4. The method according to claim 1, wherein the process gas comprises $SO_2$, $SF_4$ and $SiCl_4$.

5. The method according to claim 4, wherein a flow rate of $SO_2$ ranges from 1 to 200 sccm.

6. The method according to claim 4, wherein a flow rate of the $SF_4$ ranges from 1 to 750 sccm.

7. The method according to claim 4, wherein a flow rate of the $SiCl_4$ ranges from 5 to 400 sccm.

8. The method according to claim 4, wherein a flow rate of $SO_2$ ranges from 1 to 200 sccm, a flow rate of $SF_4$ ranges from 1 to 750 sccm and a flow rate of $SiCl_4$ ranges from 5 to 400 sccm.

9. The method according to claim 4, wherein a flow rate of $SO_2$ ranges from 1 to 100 sccm, a flow rate of $SF_4$ ranges from 1 to 300 sccm and a flow rate of $SiCl_4$ ranges from 10 to 150 sccm.

10. The method according to claim 1, wherein the process gas comprises $SO_2$, $SF_4$ and $Cl_2$.

11. The method according to claim 10, wherein a flow rate of $SO_2$ ranges from 1 to 200 sccm.

12. The method according to claim 10, wherein a flow rate of the $SF_4$ ranges from 1 to 750 sccm.

13. The method according to claim 10, wherein a flow rate of the $Cl_2$ ranges from 10 to 750 sccm.

14. The method according to claim 10, wherein a flow rate of $SO_2$ ranges from 1 to 200 sccm, a flow rate of $SF_4$ ranges from 1 to 750 sccm and a flow rate of $Cl_2$ ranges from 10 to 750 sccm.

15. The method according to claim 10, wherein a flow rate of $SO_2$ ranges from 1 to 100 sccm, a flow rate of $SF_4$ ranges from 1 to 300 sccm and a flow rate of $Cl_2$ ranges from 25 to 300 sccm.

16. The method according to claim 1, wherein the process gas comprises $SO_2$, $SiF_4$ and $SiCl_4$.

17. The method according to claim 16, wherein a flow rate of $SO_2$ ranges from 1 to 200 sccm.

18. The method according to claim 16, wherein a flow rate of the $SiF_4$ ranges from 1 to 750 sccm.

19. The method according to claim 16, wherein a flow rate of the $SiCL_4$ ranges from 5 to 400 sccm.

20. The method according to claim 17, wherein a flow rate of $SO_2$ ranges from 1 to 200 sccm, a flow rate of $SiF_4$ ranges from 1 to 750 sccm and a flow rate of $SiCl_4$ ranges from 5 to 400 sccm.

21. The method according to claim 16, wherein a flow rate of $SO_2$ ranges from 1 to 100 sccm, a flow rate of $SiF_4$ ranges from 1 to 300 sccm and a flow rate of $SiCl_4$ ranges from 10 to 150 sccm.

22. The method according to claim 1, wherein the process gas comprises $SO_2$, $SiF_4$ and $Cl_2$.

23. The method according to claim 22, wherein a flow rate of $SO_2$ ranges from 1 to 200 sccm.

24. The method according to claim 22, wherein a flow rate of the $SiF_4$ ranges from 1 to 750 scem.

25. The method according to claim 22, wherein a flow rate of the $Cl_2$ ranges from 10 to 750 sccm.

26. The method according to claim 22, wherein a flow rate of $SO_2$ ranges from 1 to 200 sccm, a flow rate of $SiF_4$ ranges from 1 to 750 sccm and a flow rate of $Cl_2$ ranges from 10 to 750 sccm.

27. The method according to claim 22, wherein a flow rate of $SO_2$ ranges from 1 to 100 sccm, a flow rate of $SiF_4$ ranges from 1 to 300 sccm and a flow rate of $Cl_2$ ranges from 25 to 300 sccm.

28. The method as claimed in claim 1, wherein the process gas further includes an inert gas.

29. The method as claimed in claim 28, wherein the inert gas comprises at least one of argon, helium, xenon and nitrogen.

30. A method of processing a substrate, the method comprising the steps of:
supplying a process gas including at least one deposition gas comprising $SO_2$ and at least one etching gas comprising either $SF_4$ or $SiF_4$; and
creating a plasma from the process gas.

31. A plasma processing system comprising:
a process chamber;
a gas injection system configured to inject a process gas within the process chamber; and
a plasma source configured to create a plasma from the process gas, wherein:
the process gas includes a first gas containing oxygen, a second gas containing fluorine and a third gas containing chlorine, and
the first gas comprises $SO_2$ and the second gas comprises $SF_4$ or $SiF_4$.

32. The system according to claim 31, wherein the plasma source comprises an inductive coil.

33. The system according to claim 31, wherein the plasma source comprises a plate electrode.

34. The system according to claim 31, wherein the third gas containing chlorine comprises at least one of $SiCl_4$ and $Cl_2$.

35. The system according to claim 31, wherein the first gas comprises $SO_2$ and the process gas further comprises $SF_4$ and $SiCl_4$.

36. The system according to claim 31, wherein the first gas comprises $SO_2$ and the process gas further comprises $SF_4$ and $Cl_2$.

37. The system according to claim 31, wherein the first gas comprises $SO_2$ and the process gas further comprises $SiF_4$ and $SiCl_4$.

38. The system according to claim 31, wherein the first gas comprises $SO_2$ and the process gas further comprises $SiF_4$ and $Cl_2$.

39. The system as claimed in claim 31, wherein the process gas further includes an inert gas.

40. The system as claimed in claim 39, wherein the inert gas comprises at least one of argon, helium, xenon and nitrogen.

41. A plasma processing system comprising:
a process chamber;
a gas injection system configured to inject a process gas within the process chamber; and
a plasma source configured to create a plasma from the process gas, wherein:
the process gas includes a deposition gas and an etching gas, and
the deposition gas includes $SO_2$ and the etching gas includes either $SF_4$ or $SiF_4$.

42. The system according to claim 41, wherein the plasma source comprises an inductive coil.

43. The system according to claim 41, wherein the plasma source comprises a plate electrode.

* * * * *